United States Patent
Suzuki et al.

(10) Patent No.: US 7,612,473 B2
(45) Date of Patent: Nov. 3, 2009

(54) DRIVING DEVICE AND METHOD

(75) Inventors: Nobukazu Suzuki, Kanagawa (JP); Gen Ichimura, Tokyo (JP); Masaru Uryu, Chiba (JP); Yoshio Ohashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 156 days.

(21) Appl. No.: 11/475,980

(22) Filed: Jun. 28, 2006

(65) Prior Publication Data

US 2007/0001631 A1  Jan. 4, 2007

(30) Foreign Application Priority Data

Jul. 4, 2005  (JP) .............................. 2005-195429

(51) Int. Cl.
*H01L 41/12* (2006.01)
*H02N 2/06* (2006.01)
(52) U.S. Cl. ........................................................ 310/26
(58) Field of Classification Search .................... 310/26
See application file for complete search history.

(56) References Cited

U.S. PATENT DOCUMENTS

| | | | | |
|---|---|---|---|---|
| 5,262,707 A | * | 11/1993 | Okazaki et al. | 318/592 |
| 2003/0160118 A1 | * | 8/2003 | Schmauser | 239/585.1 |
| 2003/0168295 A1 | * | 9/2003 | Han et al. | 188/267.1 |
| 2005/0212364 A1 | * | 9/2005 | Ohashi | 310/26 |
| 2007/0212939 A1 | * | 9/2007 | Melz et al. | 439/589 |

FOREIGN PATENT DOCUMENTS

| | | | |
|---|---|---|---|
| JP | 4-313999 | | 11/1992 |
| JP | 10-145892 | | 5/1998 |
| JP | 2001110631 | * | 4/2001 |

* cited by examiner

*Primary Examiner*—Walter Benson
*Assistant Examiner*—Derek J Rosenau
(74) *Attorney, Agent, or Firm*—Oblon, Spivak, McClelland, Maier & Neustadt, L.L.P.

(57) ABSTRACT

A driving device has a magnetostrictive actuator that drives a load member based on a driving signal, a sensor that detects an action of the load member, and a compensation unit that performs feedback compensation on the driving signal which the magnetostrictive actuator receives, based on a detection signal that is received from the sensor.

3 Claims, 12 Drawing Sheets

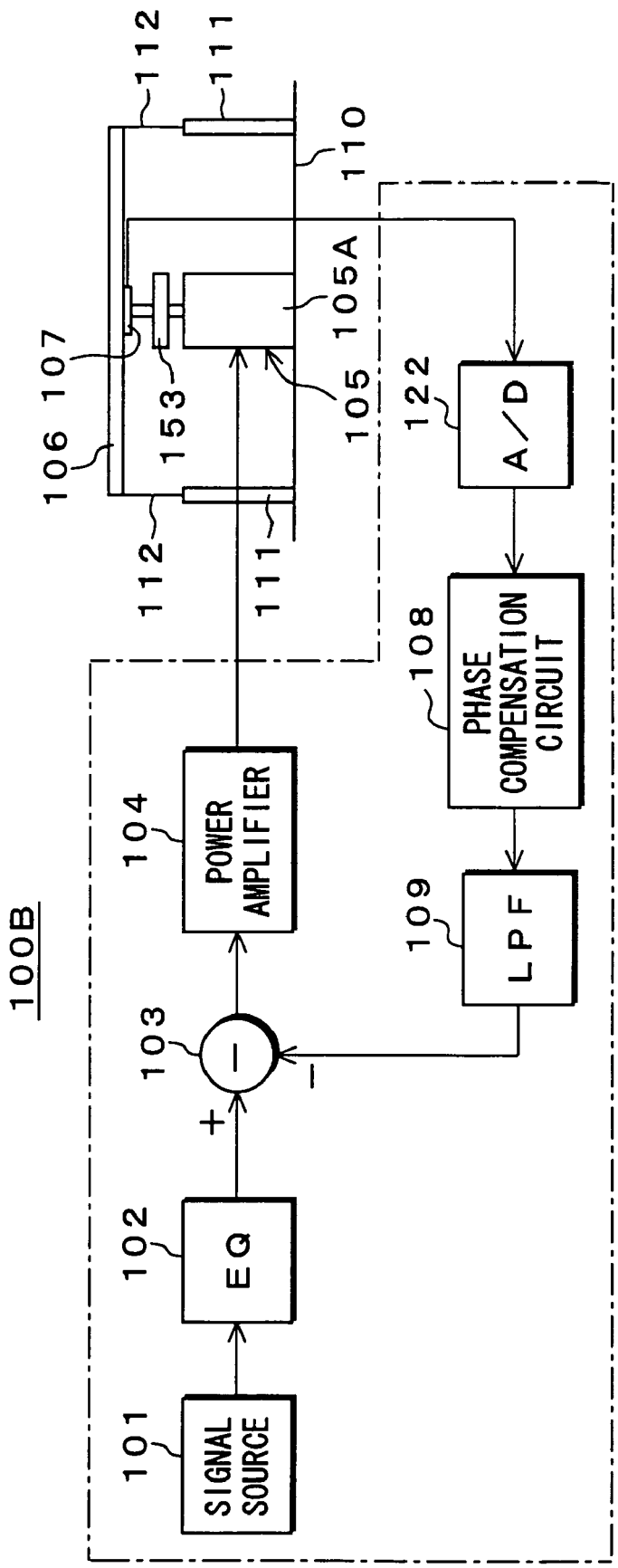

VIBRATION DETECTION SIGNAL

DRIVING DEVICE AND METHOD

CROSSREFERENCE TO RELATED APPLICATION

The present invention contains subject matter related to Japanese Patent Application No. JP 2005-195429 filed in the Japanese Patent Office on Jul. 4, 2005, the entire contents of which being incorporated herein by reference.

BACKGROUND OF THE INVENTION

1. Field of the Invention

The present invention relates to a driving device and a method for driving a load member, in which a magnetostrictive actuator drives the load member.

2. Description of Related Art

An audio output device is known in which a magnetostrictive actuator drives a diaphragm to get any audio outputs (see Japanese Patent Application Publications Nos. H10-145892 and H04-313999).

FIG. 1 shows a configuration of such an audio output device 300. The audio output device 300 has a player 301, an amplifier 302, a magnetostrictive actuator 303, and a diaphragm 304.

The player 301 reproduces any medium such as compact disc (CD), mini disc (MD), and digital versatile disc (DVD) to output an audio signal. The amplifier 302 receives the audio signal from the player 301 and amplifies it. The amplifier 302 supplies the magnetostrictive actuator 303 with the amplified audio signal. The magnetostrictive actuator 303 has a driving rod 303a for transmitting a displacement output therefrom to the diaphragm 304 to which a front end of the driving rod 303a is attached.

The magnetostrictive actuator 303 drives the diaphragm 304 based on the audio signal. That is, the driving rod 303a of the magnetostrictive actuator 303 reciprocates to vibrate the diaphragm 304 conforming to any wave forms of the audio signal. This allows the diaphragm 304 to emit an audio output corresponding to the audio signal.

SUMMARY OF THE INVENTION

The magnetostrictive actuator 303 of the audio output device 300 shown in FIG.1 is an actuator using a magnetostrictive element, a shape of which is changed when the element is subjected to an external magnetic field. If any audio signal (voltage signal) is applied to a coil for generating such an external magnetic field in the magnetostrictive actuator 303, a control current flows through the coil to generate the external magnetic field accommodating to the audio signal, thereby changing a shape of the magnetostrictive element to get any displacement in the driving rod 303a conforming to any wave forms of the audio signal.

The control current flowing through the coil has no linear relationship with the displacement in the driving rod 303a, so that accurate displacement conforming to any wave forms of the audio signal is unavailable in the diaphragm 304, thereby causing any distortions to be included in the audio output.

There are various kinds of frequency characteristics and distortions in the audio output in accordance with materials and shapes of the diaphragm 304 or how to attach the driving rod 303a to the diaphragm 304, and the like. If any performance of the magnetostrictive actuator 303 is improved, it is difficult to emit the audio outputs with a very high accuracy.

Similarly, this also applies to a case where the magnetostrictive actuator drives any driving loads.

It is desirable to provide a driving device and the like in which the magnetostrictive actuator can drive a load member with a very high accuracy.

According to an embodiment of the invention, a driving device is provided. The driving device has a magnetostrictive actuator that drives a load member based on a driving signal, a sensor that detects an action of the load member, and a compensation unit that performs feedback compensation on the driving signal which the magnetostrictive actuator receives, based on a detection signal that is received from the sensor.

On the embodiment of the invention, the magnetostrictive actuator drives a load member, for example, a diaphragm or a driving load, based on a driving signal. The sensor detects an action (vibration or movement) of the load member. The compensation unit then performs feedback compensation on the driving signal which the magnetostrictive actuator receives, based on the detection signal that is received from the sensor. It is to be noted that the magnetostrictive actuator refers to an actuator using a magnetostrictive element, a shape of which is changed when it is subjected to an external magnetic field.

Such feedback compensation provides a driving signal that is compensated. Since a phase of the detection signal in the sensor is delayed as compared with that of the driving signal received by the magnetostrictive actuator by means of the magnetostrictive actuator, the sensor and the like, this detection signal can be compensated so as to lock the phase of the detection signal with the phase of the driving signal. In order to realize oscillation-free operation, a low-pass filter removes a high-frequency component from the detection signal received from the sensor. Since frequency characteristics in the driving signal are fluctuated by the feedback compensation, an equalizer previously corrects a fluctuation in the frequency characteristics in the driving signal. A subtracter subtracts the detection signal by the sensor, which has been phase-locked and the high-frequency component of which has been removed, from the driving signal, a frequency characteristic of which has been corrected by the equalizer, thereby getting the compensated driving signal. A low-frequency component gain compensation circuit can compensate a low-frequency component of the detection signal by the sensor if a level of the detection signal by the sensor drops down in the low-frequency component thereof.

For example, as the sensor, a piezoelectric element such as a piezoelectric film and piezoelectric ceramics may be used. Since the magnetostrictive actuator generates a large amount of stress, the piezoelectric element can be used as a sensor for detecting an action of the load member. This piezoelectric element is positioned, for example, at a position between a front end of the driving rod, in the magnetostrictive actuator, for transmitting a displacement output and the load member. If the driving rod drives the load member with a front end of the driving rod contacting the load member, a contact point between the front end of the driving rod and the load member acts as driving source. Thus, if a piezoelectric element is arranged on a position between the front end of the driving rod and the load member, it is preferably possible to detect an action of the load member accompanying with the displacement of the driving rod with a very high accuracy.

For example, the driving rod of the magnetostrictive actuator has a circularly sectional configuration and has on a middle portion thereof a disc having a large diameter. The piezoelectric element has a ring shape. The piezoelectric element is positioned at a position between the disc and the load member with a front end of the driving rod contacting the load member. The piezoelectric element is sandwiched between two ring members that are made of the same material as that of the load member. In this case, since a front end of the driving rod directly contacts the load member, it is possible to detect an action of the load member based on the displacement of the driving rod very well without depending on any materials of the piezoelectric member.

Further, as the sensor, a piezoelectric element can be used. This piezoelectric element is positioned at a position between a main body of the magnetostrictive actuator and a fixed member that fixes the main body. In this case, the action of the load member by the displacement of the driving rod is transmitted to the main body of the magnetostrictive actuator via the driving rod. This allows the action of the load member by the displacement of the driving rod to be detected very well.

Additionally, as the sensor, an acceleration sensor can be also used. This acceleration sensor is arranged on the load member or a main body of the magnetostrictive actuator. The action of the load member by the displacement of the driving rod is transmitted to the main body of the magnetostrictive actuator via the driving rod. This allows the acceleration sensor to detect the action of the load member by the displacement of the driving rod with a very high accuracy. It is to be noted that the acceleration sensor is more sensitive than the piezoelectric element in general, so that amplitude when performing feedback compensation based on the detection signal can be restrained to a smaller one. This enables an adverse effect by noises occurred in a feedback system to be reduced.

Thus, performing the feedback compensation on the driving signal which the magnetostrictive actuator receives, based on a detection signal by the sensor, allows various kinds of distortions to be compensated for, such as a distortion generated in the magnetostrictive actuator based on any electromechanical conversion characteristics thereof, a distortion generated based on any materials and shapes of the load member, and a distortion generated due to how the driving rod contacts the load member or the like, a fade-out within any frequency band, a resonance peak and the like. This enables an action of the load member to be conformed to any wave forms of the driving signal with a very high accuracy, thereby causing the load member to be satisfactorily driven.

The driving device uses the magnetostrictive actuator. For example, the magnetostrictive actuator includes a magnetostrictive element made of magnetic material having magnetostrictivity and a driving rod made of ferromagnetic material, which contacts the magnetostrictive element and is movable along a displacement direction of the magnetostrictive element. The magnetostrictive actuator also includes a magnetic-field-generating unit that applies a magnetic field onto the magnetostrictive element, which is arranged around the magnetostrictive element, and a container that contains the magnetostrictive element and the magnetic-field-generating unit. In the container, a magnetic-circuit-forming member including a permanent magnet applying a biased static magnetic field to the magnetostrictive element and a ferromagnetic material is arranged around the magnetostrictive element. A clearance is provided between the driving rod and the container, thereby allowing magnetic power generated between the driving rod and the container to apply a load previously to the driving rod. According to the magnetostrictive actuator having such a configuration, the control current flowing through the coil has a nearly linear relationship with the displacement in the driving rod, so that any distortions generated based on any characteristics of the magnetostrictive actuator can be reduced, thereby reducing any burdens accompanying the feedback compensation.

Thus, according to the embodiments of the invention, the sensor detects an action of the load member and, based on the detection signal by the sensor, the feedback compensation is performed on the driving signal that the magnetostrictive actuator receives, thereby allowing the load member to be driven with a very high accuracy.

The concluding portion of this specification particularly points out and directly claims the subject matter of the present invention. However, those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS

FIG. 7 is a block diagram for showing a configuration of an audio output device according to a third embodiment of the invention;

DETAILED DESCRIPTION OF PREFERRED EMBODIMENTS

Figure 1:
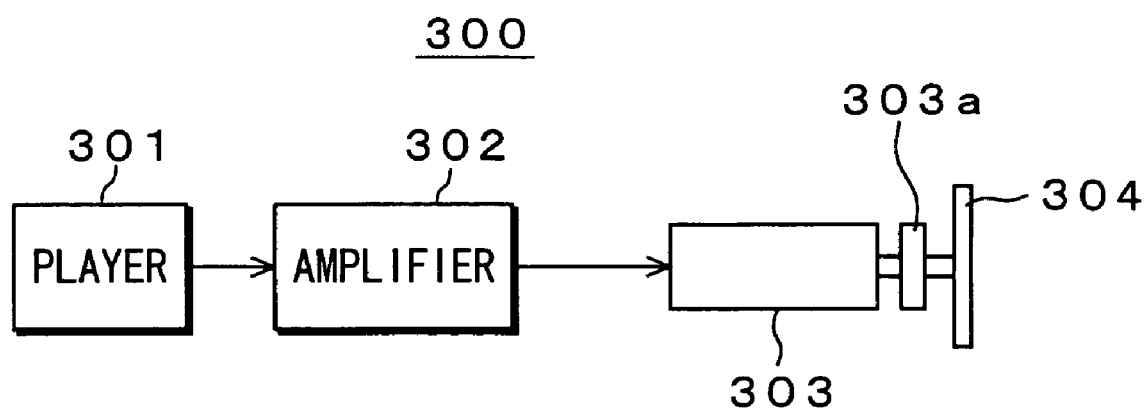
FIG. 1 is a block diagram for showing a configuration of an audio output device using a magnetostrictive actuator according to related art.

Referring now to the drawings, a driving device and a method for driving a load member according to preferred embodiments of the invention will be described specifically below.

Figure 2:
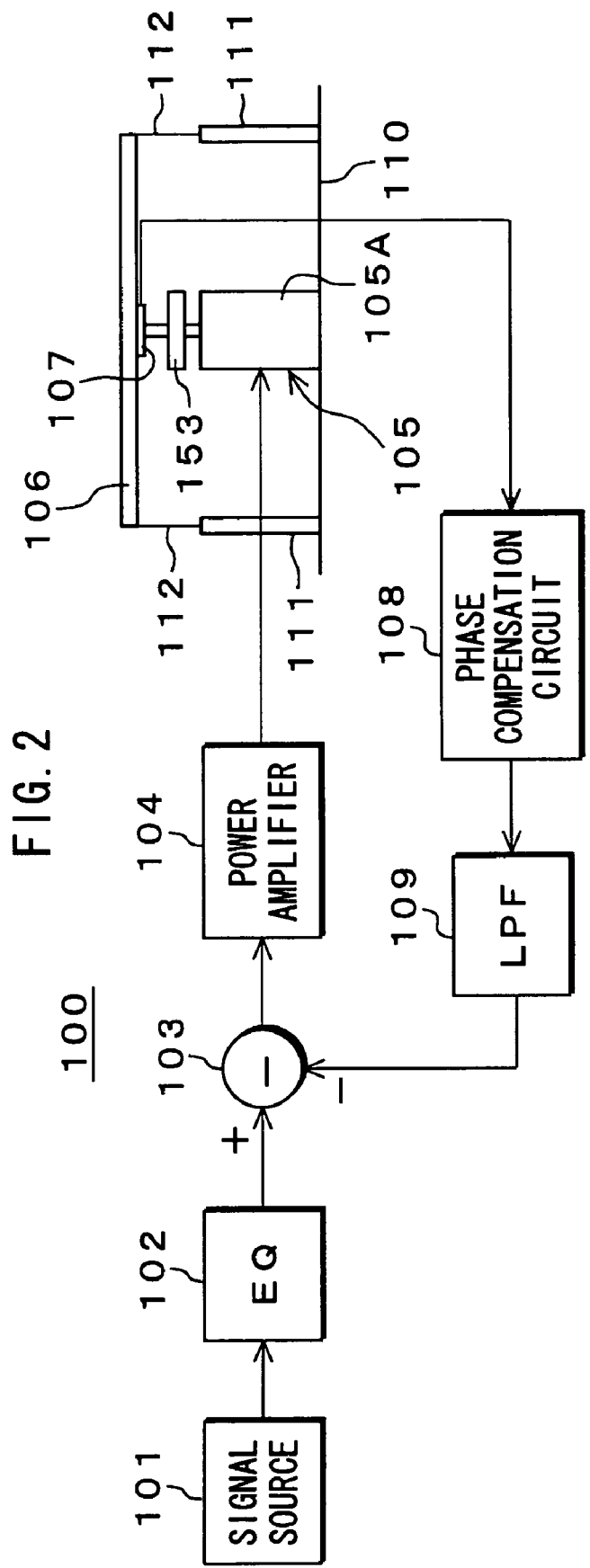
FIG. 2 is a block diagram for showing a configuration of an audio output device according to a first embodiment of the invention.

The following will describe a first embodiment of the invention. FIG. 2 shows a configuration of an audio output device 100 according to the first embodiment of the invention.

The audio output device 100 has a signal source 101, an equalizer 102, a subtracter 103, a power amplifier 104, a magnetostrictive actuator 105, a diaphragm 106, a piezoelectric element 107, a phase compensation circuit 108, and a low pass filter (LPF) 109. The equalizer 102, the subtracter 103, the phase compensation circuit 108, and the LPF 109 constitute a compensation unit for performing feedback compensation on an audio signal that the magnetostrictive actuator 105 receives. The diaphragm 106 constitutes a load member that the magnetostrictive actuator 105 drives.

The signal source 101 includes a player for reproducing CD, MD, DVD or the like to output an audio signal, a tuner for receiving a broadcast signal to get an audio signal therefrom and the like. The equalizer 102 corrects any frequency characteristics of the audio signal received from the signal source 101. That is, because the feedback compensation generates a fluctuation in a frequency characteristic of the audio signal, which will be described later, the equalizer 102 previously corrects the fluctuation in the frequency characteristic of the audio signal.

In this embodiment, if the magnetostrictive actuator 105, the diaphragm 106, the piezoelectric element 107, the phase compensation circuit 108, the LPF 109 and the like are respectively fixed, the frequency characteristic of the audio output device 100 can be uniquely identified. The equalizer 102 corrects the frequency characteristics of the audio signal with the frequency characteristic thereof being compared with the frequency characteristic of the audio signal on which no feedback compensation is performed so that the frequency characteristic of the audio signal can be finally conformed to the frequency characteristic of the audio signal on which no feedback compensation is performed.

The phase compensation circuit 108 compensates a phase of a vibration (action) detection signal of the diaphragm 106, which the piezoelectric element 107 outputs, to phase-lock it into a phase of the audio signal output from the equalizer 102. It is to be noted that the phase of the vibration detection signal is delayed from the phase of the audio signal output from the equalizer 102 by means of the magnetostrictive actuator 105, the piezoelectric element 107, and the like. The LPF 109 removes from the vibration detection signal that has been phase-locked in the phase compensation circuit 108 a high-frequency component thereof.

The subtracter 103 subtracts the vibration detection signal received from LPF 109 from the audio signal, a frequency characteristic of which has been corrected by the equalizer 102, thereby getting the compensated audio signal. The power amplifier 104 receives the compensated audio signal from the subtracter 103 and amplifies it, and supplies the amplified audio signal to the magnetostrictive actuator 105 as a driving signal.

The magnetostrictive actuator 105 drives the diaphragm 106 based on the audio signal that has been amplified in the power amplifier 104. The magnetostrictive actuator 105 is fixed on a fixing member 110, for example, a chassis of audio equipment, through a main body 105A thereof. The magnetostrictive actuator 105 has a driving rod 153 that transmits any displacement outputs. The piezoelectric element 107 constitutes a sensor that detects any vibrations of the diaphragm 106 and is composed of a piezoelectric film, piezoelectric ceramics, and the like.

The piezoelectric element 107 is positioned at a position between a front end of the driving rod 153 and the diaphragm 106. If the driving rod 153 drives the diaphragm 106 with a front end of the driving rod 153 contacting the diaphragm 106, a contact point between the front end of the driving rod 153 and the diaphragm 106 acts as a point sound source. Thus, by arranging the piezoelectric element 107 on a position between the front end of the driving rod 153 and the diaphragm 106, it is possible to detect a vibration (action) of the diaphragm 106 accompanying with the displacement of the driving rod 153 with a very high accuracy. It is to be noted that sides of the diaphragm 106 are supported by an edge 112 that is mounted on a frame 111 fixed on the fixing member 110.

Figure 3:
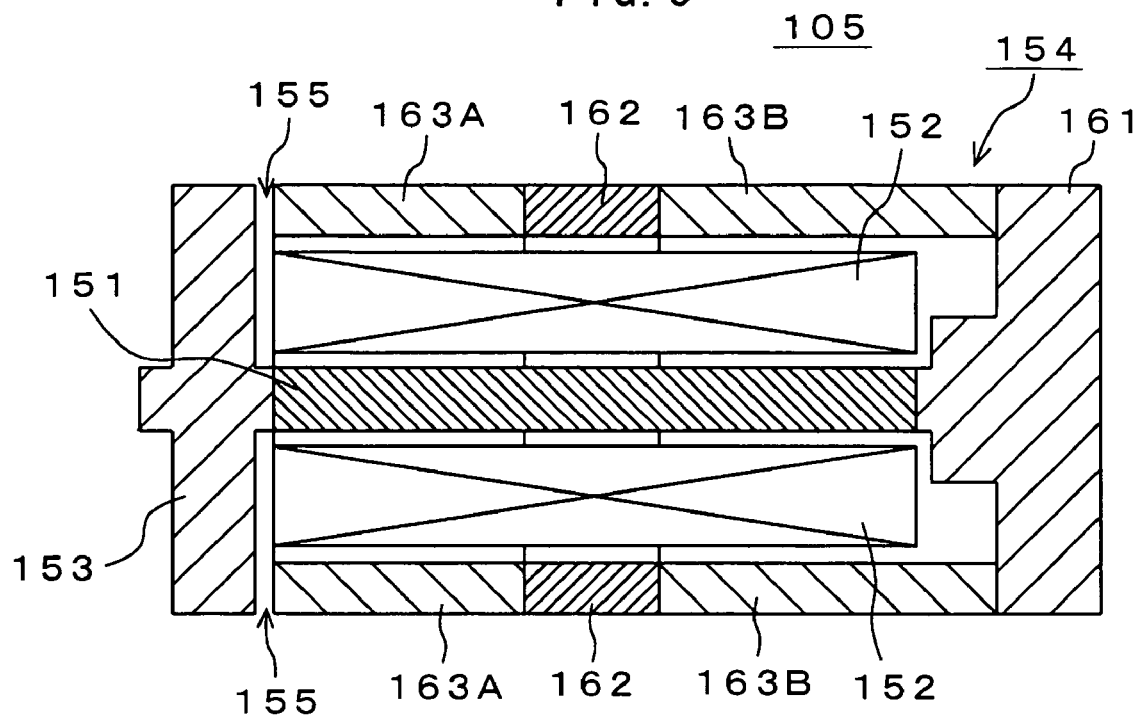
FIG. 3 is a schematically sectional view of a magnetostrictive actuator.

FIG. 3 shows a configuration of the magnetostrictive actuator 105. The magnetostrictive actuator 105 has a rod-like magnetostrictive element 151 that produces any displacement along its length; a solenoid coil 152, which is arranged around the magnetostrictive element 151, that produces a control magnetic field applied to the magnetostrictive element 151; a driving rod 153 as a movable member, which is connected to an end of the magnetostrictive element 151, that transmits any displacements produced by the magnetostrictive element 151; and a container 154 that contains the magnetostrictive element 151 and the solenoid coil 152.

A supporting disk 161, a permanent magnet 162, and tube-like cases 163A, 163B constitute the container 154. The supporting disk 161 contacts the other end of the magnetostrictive element 151 to support the magnetostrictive element 151. The permanent magnet 162, which applies a biased static magnetic field to the magnetostrictive element 151, and the tube-like cases 163A, 163B, which constitute a magnetic circuit, are arranged around the magnetostrictive element 151 in the container 154. The tube-like case 163A is attached to the permanent magnet 162 at an end thereof on a side of the driving rod 153. The tube-like case 163B is attached to the permanent magnet 162 at the other end thereof on a side of the supporting disk 161. Using a ferromagnetic material as the tube-like cases 163A, 163B enables the biased static magnetic field to be efficiently applied to the magnetostrictive element 151. Using a ferromagnetic material as the supporting disk 161 enables the biased static magnetic field to be further efficiently applied to the magnetostrictive element 151.

There is a clearance 155 between the driving rod 153 and the container 154. The ferromagnetic material is used as the driving rod 153 so that the permanent magnet 162 attracts the driving rod 153. This causes magnetic power of attraction to occur between the driving rod 153 and the container 154. The magnetic power of attraction causes a load to be applied to the magnetostrictive element 151 that is attached to the driving rod 153.

Figure 4:
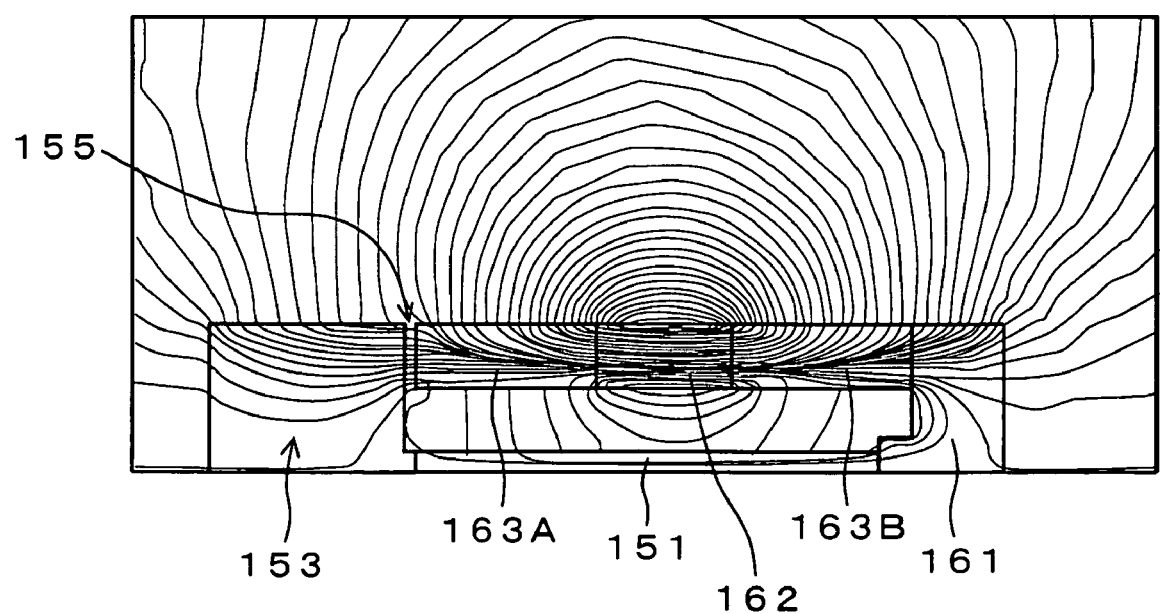
FIG. 4 is a diagram for showing a magnetic flux of the magnetostrictive actuator.

FIG. 4 shows a magnetic flux of the magnetostrictive actuator 105 shown in FIG. 3. The magnetic flux comes out of the permanent magnet 162, passing through the tube-like case 163A, the clearance 155, and the driving rod 153 and comes back to the permanent magnet 162, passing through the supporting disk 161 and the tube-like case 163B. This causes the magnetic power of attraction to occur between the driving rod 153 and the container 154, thereby applying a load to the magnetostrictive element 151 by the magnetic power of attraction.

A part of the magnetic flux comes out of the permanent magnet 162, passing through the tube-like case 163A, the clearance 155, and the driving rod 153, and the magnetostrictive element 151 and comes back to the permanent magnet 162, passing through the supporting disk 161 and the tube-like case 163B. This allows a biased static magnetic field to be applied to the magnetostrictive element 151.

In this magnetostrictive actuator 105, the driving rod 153 is not supported by a bearing. Therefore, no friction occurs between the driving rod 153 and the bearing. This allows a loss of displacement output of the magnetostrictive actuator 105 to be vastly decreased.

In this magnetostrictive actuator 105, the magnetic power of attraction applies a load to the magnetostrictive element 151. Thus, it is possible to continue applying a load to the magnetostrictive element 151 stably even if a period of displacement of the magnetostrictive element 151 is short. This enables the magnetostrictive actuator 105 to produce a displacement output correctly according to a control current supplied to the solenoid coil 152.

Thus, according to the magnetostrictive actuator 105, a control current flowing through the solenoid coil 152 has a nearly linear relationship with the displacement in the driving rod 153, so that any distortions generated based on any characteristics of the magnetostrictive actuator 105 can be reduced, thereby reducing any burdens accompanying a feedback compensation.

In this magnetostrictive actuator 105, the permanent magnet 162 is arranged between two tube-like cases 163A, 163B, so that the magnetostrictive actuator 105 can apply the biased static magnetic field to the magnetostrictive element 151 more equally as compared with a case where a magnetostrictive actuator in which the permanent magnet is arranged at a position of the supporting disk 161 applies the magnetic field to the magnetostrictive element 151. A bearing for supporting the driving rod 153, a connection for connecting the driving rod 153 with the container 154, and a spring for applying a load to the magnetostrictive element 151 are not necessary in this magnetostrictive actuator 105. This allows magnetostrictive actuators 105 that are small in size and low in price to be easily made.

The following will describe operations of the audio output device 100 shown in FIG. 2. The signal source 101 transmits an audio signal and the equalizer 102 receives the audio signal and corrects in advance its frequency characteristics of the audio signal to be fluctuated by the feedback compensation. The equalizer 102 transmits the corrected audio signal, the frequency characteristics of which have been corrected in advance in the equalizer 102, to a positive input terminal of the subtracter 103.

The piezoelectric element 107 also transmits a vibration detection signal of the diaphragm 106 to the phase compensation circuit 108. The phase compensation circuit 108 compensates the phase of the vibration detection signal so as to lock the phase of the detection signal into a phase of the audio signal output from the equalizer 102. The phase compensation circuit 108 transmits the vibration detection signal thus phase-locked in it to the LPF 109. The LPF 109 then limits a bandwidth of the vibration detection signal and removes from it a high-frequency component thereof, in order to realize oscillation-free operation by the feedback compensation. The LPF 109 transmits the limited vibration detection signal to a negative input terminal of the subtracter 103.

The subtracter 103 subtracts the vibration detection signal received from the LOF 109 from the audio signal received from the equalizer 102, thereby getting the compensated audio signal by the feedback compensation. The power amplifier 104 amplifies this compensated audio signal and then transmits it to the magnetostrictive actuator 105 as a driving signal. The magnetostrictive actuator 105 drives the diaphragm 106 based on this amplified and compensated audio signal. In this case, a control current conforming to the audio signal flows through the solenoid coil 152 in the magnetostrictive actuator 105, so that an external magnetic field conforming to the audio signal occurs. This causes the magnetostrictive element 151 to be subjected to the external magnetic field to change a shape of the magnetostrictive element 151, thereby getting any displacement in the driving rod 153 conforming to the audio signal. The driving rod 153 transmits this displacement to the diaphragm 106 by which an audio output conforming to the audio signal can be given.

According to the audio output device 100 shown in FIG. 2, the vibration detection signal that the piezoelectric element 107 gets contains any information on various kinds of distortions such as a distortion generated in the magnetostrictive actuator 105 based on any electromechanical conversion characteristics thereof and a distortion generated based on any materials and shapes of the diaphragm 106, a distortion generated due to how the driving rod 153 contacts the diaphragm 106 or the like, a fade-out within any frequency band, a resonance peak and the like. Thus, in the audio signal on which the feedback compensation is performed on the basis of this vibration detection signal, the distortions and the like may be compensated. This enables a vibration of the diaphragm 106 to be conformed to a wave form of the audio signal with a high accuracy, thereby causing the audio output with a high quality.

It is to be noted that although the LPF 109 has limited the bandwidth of the vibration detection signal after the phase compensation circuit 108 has phase-locked the vibration detection signal, the invention is not limited thereto. The phase compensation circuit 108 may phase-lock the vibration detection signal after the LPF 109 has limited the bandwidth of the vibration detection signal.

Although in the audio output device 100 shown in FIG. 2, the vibration detection signal output from the piezoelectric element 107 has been used as it is, the vibration detection signal may be naturally used after it has been amplified by an amplifier, which is not shown, depending on the situation.

Figure 5:
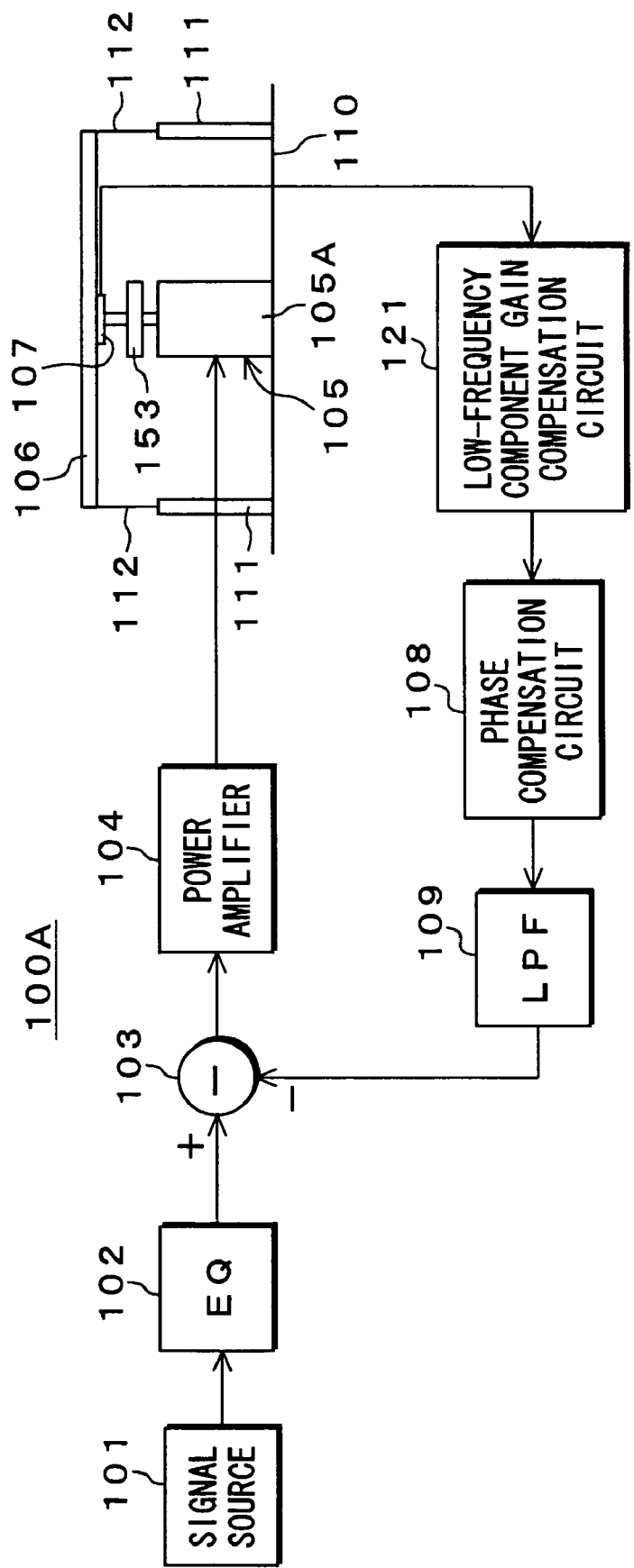
FIG. 5 is a block diagram for showing a configuration of an audio output device according to a second embodiment of the invention.

The following will describe an audio output device according to a second embodiment of the invention. FIG. 5 shows a configuration of the audio output device 100A according to the second embodiment of the invention. In FIG. 5, like reference characters refer to like elements shown in FIG. 2, detailed explanation of which will be omitted.

This audio output device 100A has a low-frequency component gain compensation circuit 121 positioned between the piezoelectric element 107 and the phase compensation circuit 108. This low-frequency component gain compensation circuit 121 compensates a low-frequency component of the vibration detection signal obtained by the piezoelectric element 107. Any other components of the audio output device 100A have configurations identical to those of the components of the audio output device 100 shown in FIG. 2.

Figure 6A:
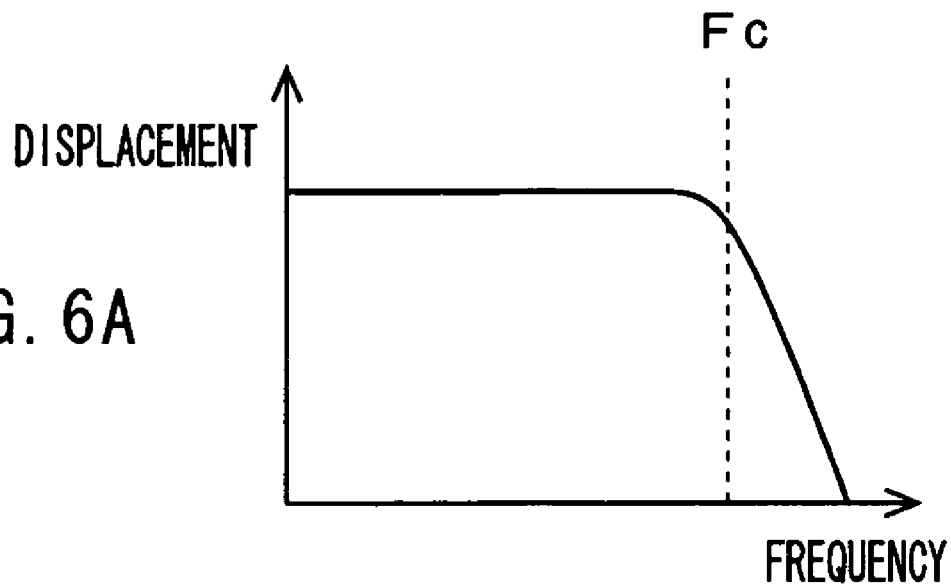
FIGS. 6A and 6B are graphs each for showing characteristic of the magnetostrictive element in general.

FIG. 6A is a graph for showing displacement characteristic of the magnetostrictive element in general. In the graph, a flat characteristic is shown up to a frequency Fc. The frequency Fc is depended on a diameter of the magnetostrictive element. The smaller the diameter that the magnetostrictive element has, the higher the frequency Fc that can be obtained. The vibration detection signal obtained by the piezoelectric element 107 relates to a detection signal on acceleration. A level of this vibration detection signal on acceleration drops down from the frequency Fc toward a low-frequency region, as shown in FIG. 6B.

Figure 6B:
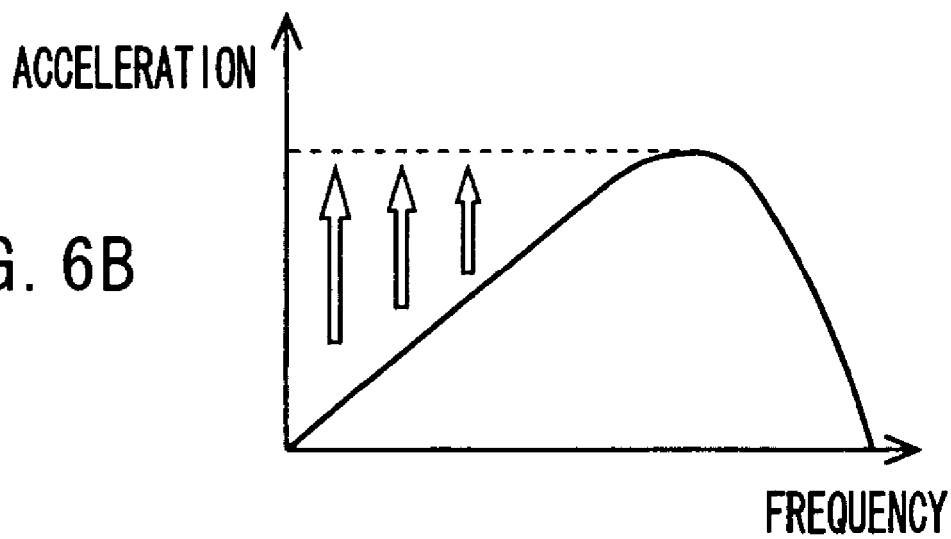

The above low-frequency component gain compensation circuit 121 compensates the low-frequency region in the vibration detection signal, in which a level of the vibration detection signal drops down, to lift the level up as shown by arrows in FIG. 6B. In this case, it is not necessary that a completely flat characteristic within a frequency region below the frequency Fc can be given. Depending on performance of the amplifier constituting the low-frequency component gain compensation circuit 121, it may be compensated to get a nearly flat characteristic.

In the audio output device 100A shown in FIG. 5, the low-frequency component gain compensation circuit 121 compensates a low-frequency component in the vibration detection signal received from the piezoelectric element 107 and then transmits it to the phase compensation circuit 108. The subtracter 103 subtracts from the audio signal received from the equalizer 102 the vibration detection signal, a low-frequency component of which the low-frequency component gain compensation circuit 121 compensates, a phase of which is phase-locked in the phase compensation circuit 108, and a bandwidth of which is limited in the LPF 109. This allows the audio signal on which the feedback compensation is performed to be obtained. Any other operations of this audio output device 100A are similar to those of the audio output device 100 shown in FIG. 2.

According to the audio output device 100A shown in FIG. 5, excellent effects similar to those of the audio output device 100 shown in FIG. 2 can be given as well as the audio output with a very high quality can be also given because the low-frequency component gain compensation circuit 121 compensates a low-frequency component in the vibration detection signal received from the piezoelectric element 107 and any distortions within a frequency range below the frequency Fc may be expected to be improved.

Although in the audio output device 100A shown in FIG. 5, the LPF 109 has limited a bandwidth of the vibration detection signal after the low-frequency component gain compensation circuit 121 has compensated a low-frequency component in the vibration detection signal and the phase compensation circuit 108 has locked the phase of the vibration detection signal, any order of the compensation of the low-frequency component, the phase lock, and the limitation of bandwidth may be approved in this invention.

The following will describe an audio output device according to a third embodiment of the invention. FIG. 7 shows a configuration of the audio output device 100B according to the third embodiment of the invention. In FIG. 7, like reference characters refer to like elements shown in FIG. 2, detailed explanation of which will be omitted. This audio output device 100B is configured as a digital system.

In the audio output device 100B, a signal source 101, an equalizer 102, a subtracter 103, a power amplifier 104, a phase compensation circuit 108, and an LPF 109, which are enclosed by alternate long and short dashed lines, constitute a digital region thereof. In this embodiment, the digital region includes an A/D converter 122 that converts an analog signal to a digital signal. The A/D converter 122 receives the vibration detection signal from the piezoelectric element 107, converts it from its analog form to its digital form, and then supplies the digital signal to the phase compensation circuit 108. Any other components of this audio output device 100B are similar to those of the audio output device 100 shown in FIG. 2. The operations of this audio output device 100B are similar to those of the audio output device 100 shown in FIG. 2.

According to the audio output device 100B, excellent effects similar to those of the audio output device 100 shown in FIG. 2 can be given as well as the following excellent effects can be also given due to the digital system configuration thereof. Namely, it is possible to further improve any reliability when manufacturing in large quantities of products (because the digital system is prevented from being susceptible to any heat and fluctuations in devices) and accuracy in the feedback compensation.

Every time when the frequency or phase characteristic varies, it is desirable to correct the characteristics of the equalizer 102, the phase compensation circuit 108 and the like. If the equalizer 102, phase compensation circuit 108 and the like are designed as the digital circuit, they deal with their characteristic variations easily. If a system is configured under the one-bit signal processing such as direct stream digital (DSD), the audio signal that the power amplifier 104 transmits to the magnetostrictive actuator 105 can be also digitalized so that the system is completely digitalized in the audio output device 100B.

Figure 8:
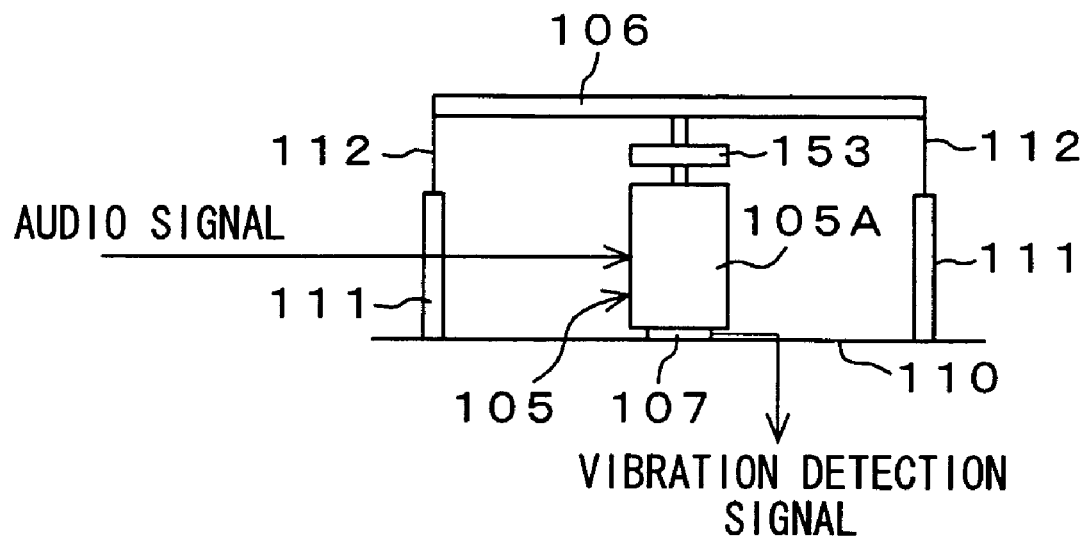
FIG. 8 is a diagram for showing an arrangement example of a piezoelectric element.

Although in the above embodiments, the piezoelectric element 107 has been arranged between a front end of the driving rod 153 and the diaphragm 106, the piezoelectric element 107 can be arranged between a main body of the magnetostrictive actuator 105 and the fixing member 110 that fixes the main body, as shown in FIG. 8. In this case, the vibration (action) of the diaphragm 106 by the displacement of the driving rod 153 is transmitted to the main body of the magnetostrictive actuator 105 via the driving rod 153. This allows the vibration of the diaphragm 106 by the displacement of the driving rod 153 to be detected very well in the piezoelectric element 107.

Figure 9:
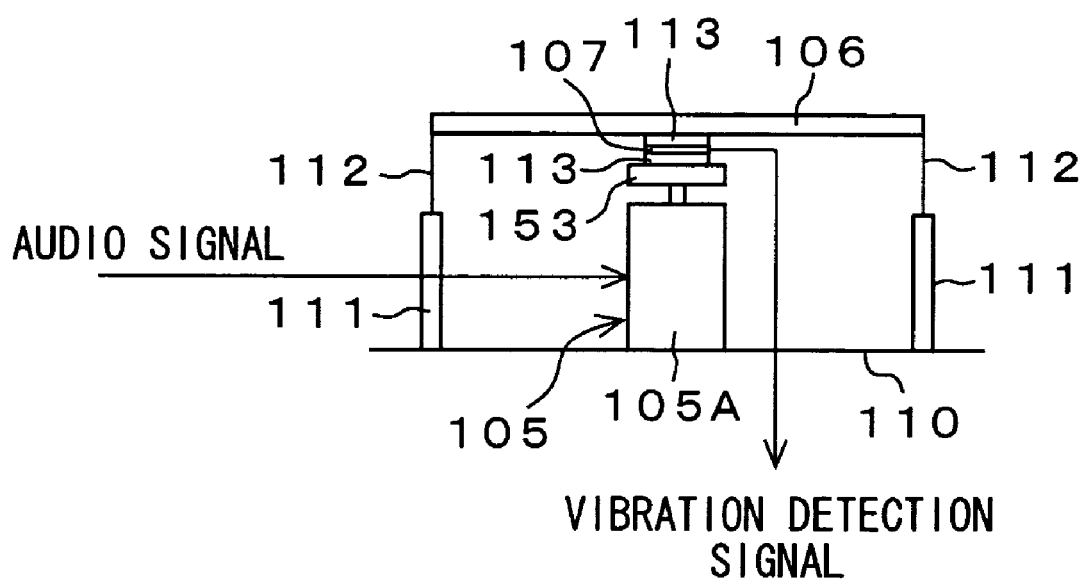
FIG. 9 is a diagram for showing an arrangement example of a piezoelectric element.
Figure 10:
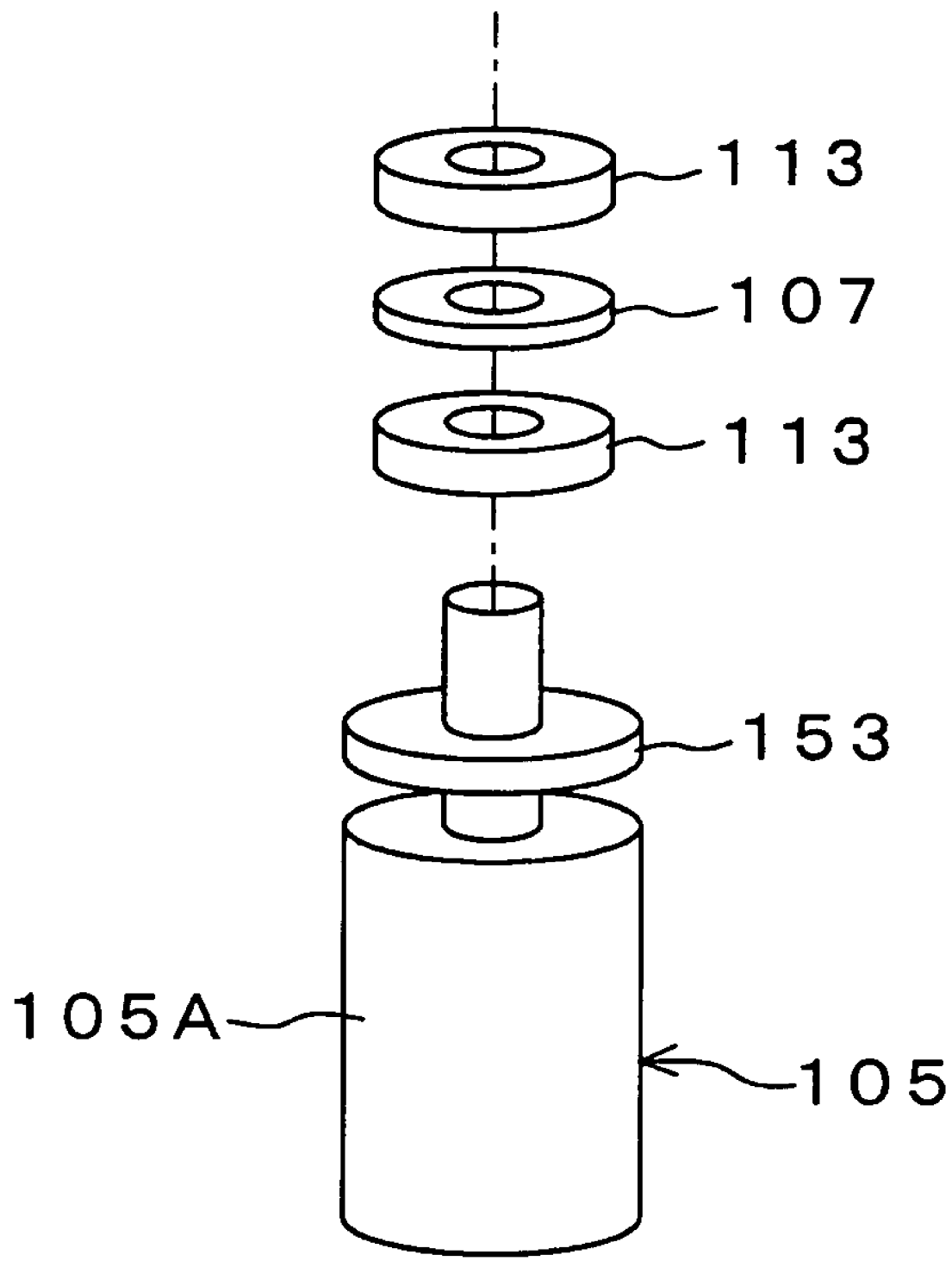
FIG. 10 is an exploded view of the piezoelectric element.

Further, although in the above embodiments, the piezoelectric element 107 has been arranged between the front end of the driving rod 153 and the diaphragm 106, the piezoelectric element 107 can be arranged as shown in FIG. 9. In this case, the piezoelectric element 107 has a ring-shaped configuration as shown in FIG. 10. It is to be noted that the driving rod 153 of the magnetostrictive actuator 105 is composed of a rod having a circularly sectional configuration and having, on a middle portion thereof, a disc having a large diameter, as shown in FIG. 10.

The piezoelectric element 107 is positioned at a position between the disc of the driving rod 153 and the diaphragm 106 with a front end of the driving rod 153 contacting the diaphragm 106. The piezoelectric element 107 is sandwiched between two ring-shaped members 113, 113 that are made of the same material as that of the diaphragm 106.

In this embodiment, since the front end of the driving rod 153 of the magnetostrictive actuator 105 directly contacts the diaphragm 106, the piezoelectric element 107 can detect a vibration of the diaphragm 106 by the displacement of the driving rod 153 very well without depending on any materials of the piezoelectric element 107.

Figure 11:
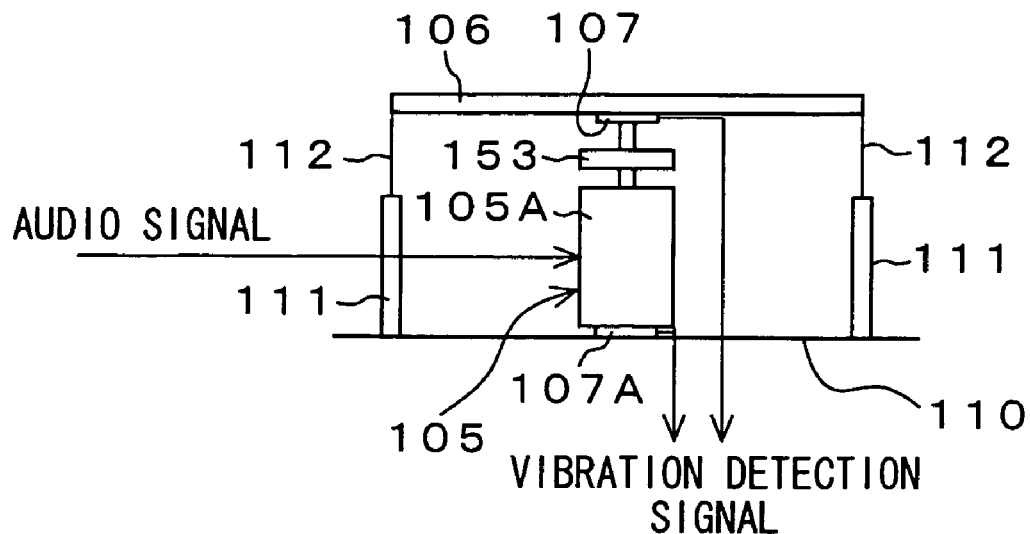
FIG. 11 is a diagram for showing an arrangement example of a piezoelectric element.

Additionally, although in the above embodiments the piezoelectric element 107 has been arranged between the front end of the driving rod 153 and the diaphragm 106, another piezoelectric elements 107A can be arranged between a main body 105A of the magnetostrictive actuator 105 and the fixing member 110 that fixes the main body 105A, as shown in FIG. 11. In this embodiment, the vibration detection signals of the piezoelectric elements 107, 107A are averaged and fed back. This enables a more accurate system to be configured. In this embodiment, if the vibration detection signals that have different polarities to each other are obtained from the piezoelectric elements 107, 107A, and a differential amplifier, which is not shown, receives these vibration detection signals to configure a feedback system, it is possible to improve S/N ratios in the piezoelectric element 107, 107A. This enables the audio output device 100B to have a resistance against a noise due to any line routes following the piezoelectric elements 107, 107A.

Figure 12:
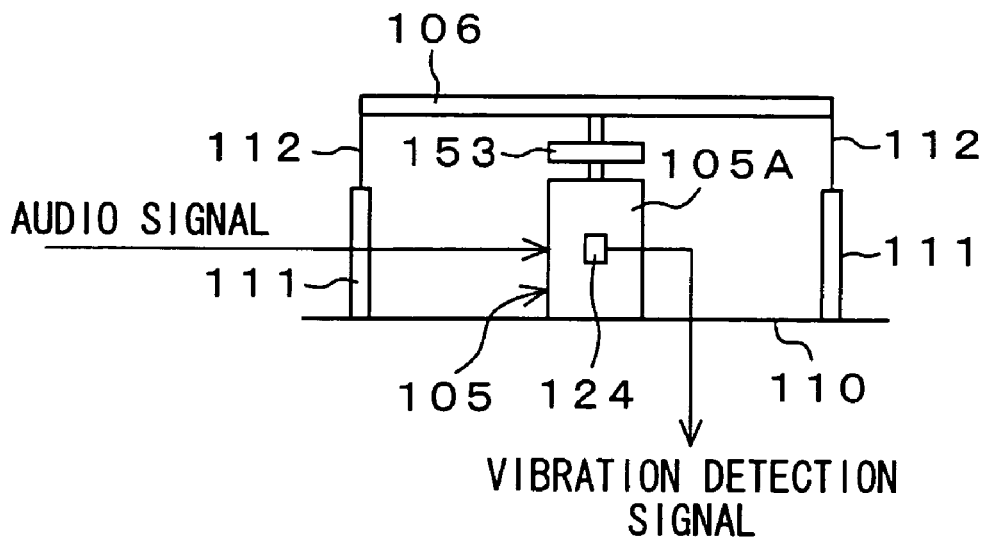
FIG. 12 is a diagram for showing an arrangement example of an acceleration sensor.
Figure 13:
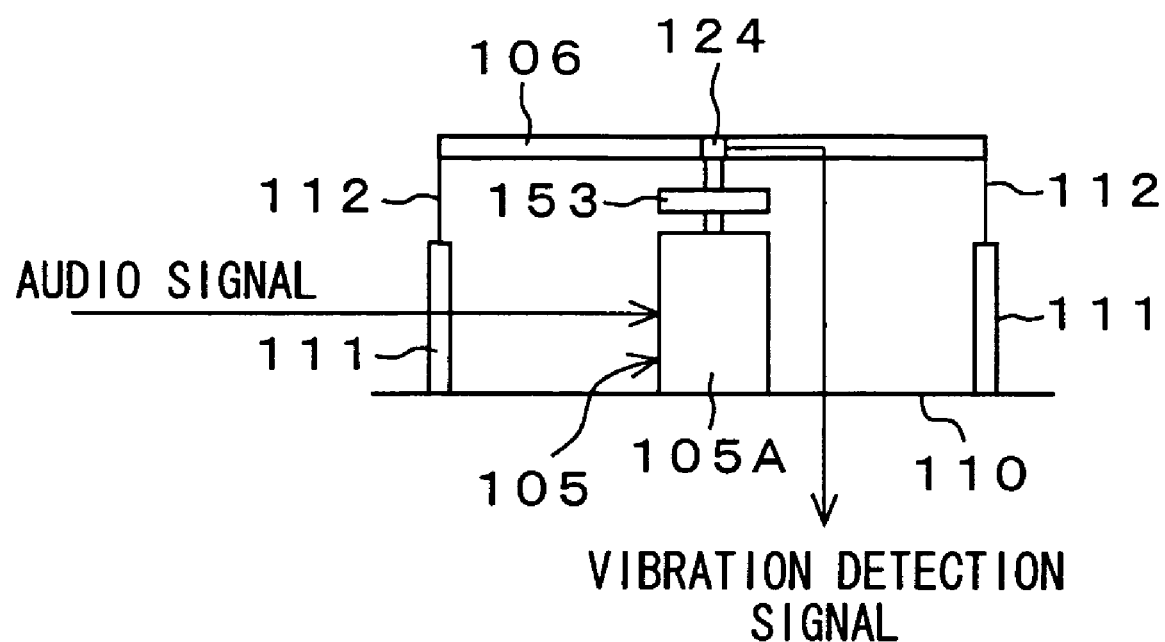
FIG. 13 is a diagram for showing an arrangement example of an acceleration sensor.

Although in the above embodiments, as the sensor, the piezoelectric element 107 has been used, an acceleration sensor 124 can be used as the sensor 124 instead of the piezoelectric element 107. The acceleration sensor 124 is arranged on, for example, the main body 105A of the magnetostrictive actuator 105, as shown in FIG. 12 or, for example, the diaphragm 106, as shown in FIG. 13.

A vibration of the diaphragm 106 by the displacement of the driving rod 153 is transmitted to the main body 105A of the magnetostrictive actuator 105 via the driving rod 153. Thus, the acceleration sensor 124 arranged on the main body of the magnetostrictive actuator 105 or the diaphragm 106 can detect a vibration of the diaphragm 106 by the displacement of the driving rod 153 very well.

Since the acceleration sensor 124 is more sensitive than the piezoelectric element 107 in general, if using the acceleration sensor 124, an amplitude rate when performing the feedback compensation based on the output signal thereof can be restrained to a smaller one. This enables an adverse effect due to noises occurring in a feedback system to be reduced.

Figure 14A:
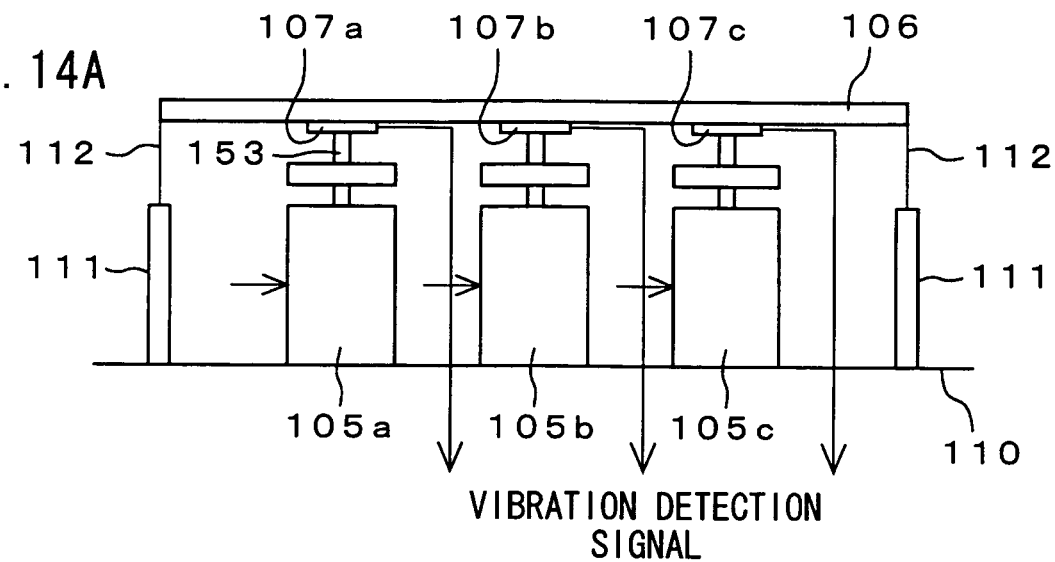
FIG. 14A is a diagram for showing a configuration of an audio output device in which plural magnetostrictive actuators are provided and FIG. 14B is a plan view of the audio output device shown in FIG. 14A without the diaphragm.
Figure 14B:
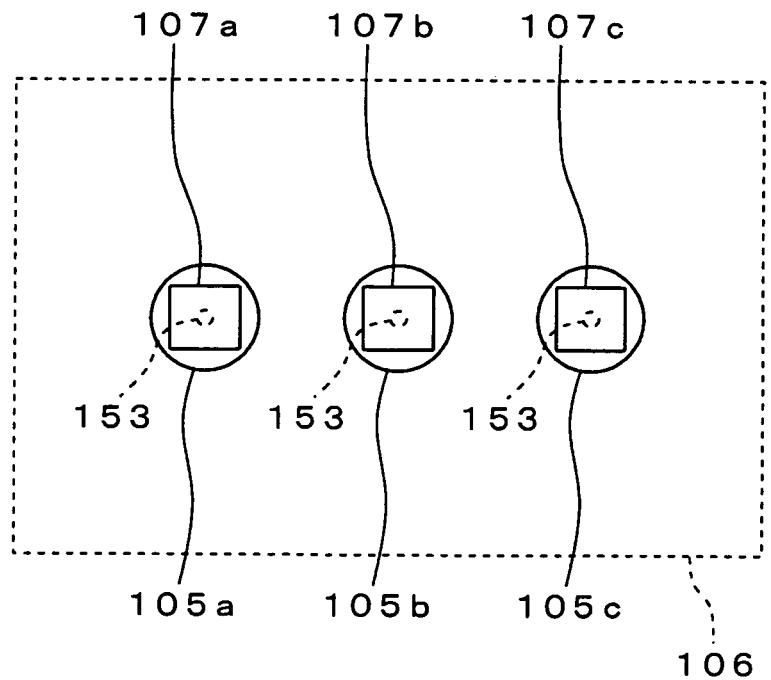

Although in the above embodiments, one magnetostrictive actuator 105 has driven the diaphragm 106, plural magnetostrictive actuators relative to a stereo reproduction or a multimedia reproduction, to which plural audio signals are respectively supplied, can be used. If any feedback compensation similar thereto is performed in the audio output device in which plural magnetostrictive actuators 105 drive the diaphragm 106, it is also possible to obtain audio output with a high quality. FIGS. 14A, 14B show that three magnetostrictive actuators 105a, 105b, 105c drive the common diaphragm 106. FIG. 14A is a side view thereof and FIG. 14B is a plan view thereof.

In this embodiment, the piezoelectric elements, 107a, 107b, 107c are respectively arranged between a front end of each of the driving rods 153 of the magnetostrictive actuators 105a, 105b, 105c and the diaphragm 106. Respective piezoelectric elements, 107a, 107b, 107c transmit the vibration detection signals. These vibration detection signals are respectively used in the feedback compensation of the magnetostrictive actuators 105a, 105b, 105c. Arranging the piezoelectric elements, 107a, 107b, 107c respectively for the magnetostrictive actuators 105a, 105b, 105c independently allows any interference of each channel on an identical plane to be prevented, thereby improving a localization of an acoustic image on the same diaphragm.

Figure 15:
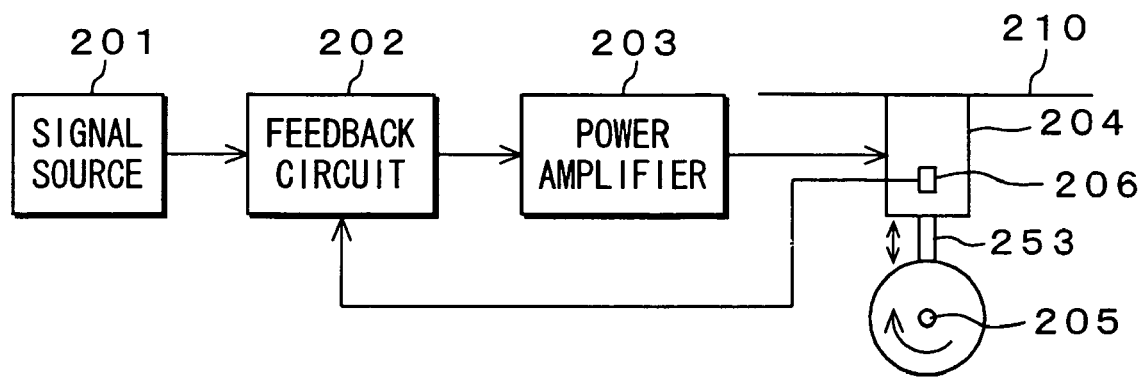
FIG. 15 is a block diagram for showing a configuration of a drive output device according to a fourth embodiment of the invention.

The following will describe a drive output device according to a fourth embodiment of the invention. FIG. 15 shows a configuration of the drive output device 200 according to the fourth embodiment of the invention.

The drive output device 200 has a signal source 201, a feedback circuit 202, a power amplifier 203, a magnetostrictive actuator 204, a driving load 205, and an acceleration sensor 206.

The magnetostrictive actuator 204 has a configuration similar to that of the above magnetostrictive actuator 105. A driving rod 253 thereof corresponds to the driving rod 153 of the magnetostrictive actuator 105 (see FIGS. 3 and 4). A main body of the magnetostrictive actuator 204 is fixed on the fixing member 210. The driving load 205 constitutes a load member of the magnetostrictive actuator 204. This driving load 205, for example, a crank shaft, rotates based on reciprocation of the driving rod 253 in the magnetostrictive actuator 204.

The signal source 201 transmits a driving signal for rotating the driving load 205. The feedback circuit 202 performs any feedback compensation on the driving signal received from the signal source 201 based on the detection signal by the acceleration sensor 204. This feedback circuit 202 has various kinds of components corresponding to the equalizer 102, the subtracter 103, the phase compensation circuit 108, and the LPF 109 of the audio output device 100 shown in FIG. 2 or the equalizer 102, the subtracter 103, the phase compensation circuit 108, the LPF 109, and the low-frequency component gain compensation circuit 121 of the audio output device 100A shown in FIG. 5. Operations of the feedback circuit 202 are similar to those of the components.

The power amplifier 203 amplifies the driving signal thus compensated in the feedback circuit 202 and supplies it to the magnetostrictive actuator 204 as a driving signal. The magnetostrictive actuator 204 drives the driving load 205 based on the driving signal amplified by the power amplifier 203. The acceleration sensor 206 is arranged on the main body of the magnetostrictive actuator 204. In this case, an action of the driving load 205 by the displacement of the driving rod 253 is transmitted to the main body of the magnetostrictive actuator 204 via the driving rod 253. Thus, the acceleration sensor 206 arranged on the main body of the magnetostrictive actuator 204 can detect the action of the driving load 205 by the displacement of the driving rod 253 very well.

The following will describe operations of the drive output device 200 shown in FIG. 15.

The signal source 201 transmits the driving signal. The feedback circuit 202 receives the driving signal to perform any feedback compensation on the driving signal based on the detection signal of the acceleration sensor 206 and transmits it to the power amplifier 203. The power amplifier 203 receives the compensated driving signal from the feedback circuit 202 to amplify it and transmits it to the magnetostrictive actuator 204. The magnetostrictive actuator 204 drives the driving load 205 based on the driving signal to rotate the driving load 205.

According to the drive output device 200 shown in FIG. 15, the detection signal output from the acceleration sensor 206 contains various kinds of information on distortions such as a distortion generated in the magnetostrictive actuator 204 based on any electromechanical conversion characteristics thereof, a distortion generated based on any materials and shapes of the driving load 205, a distortion generated due to how the driving rod 253 contacts the driving load 205 or the like, a fade-out within any frequency band, a resonance peak and the like. Thus, the driving signal on which the feedback compensation is performed based on the detection signal of the acceleration sensor 206 can compensate the distortions and the like. This enables an action of the driving load 205 to be conformed to a wave form of the driving signal output from the signal source 201 with a very high accuracy, thereby causing accuracy of the driving load 205 to be satisfactorily improved.

Figure 16:
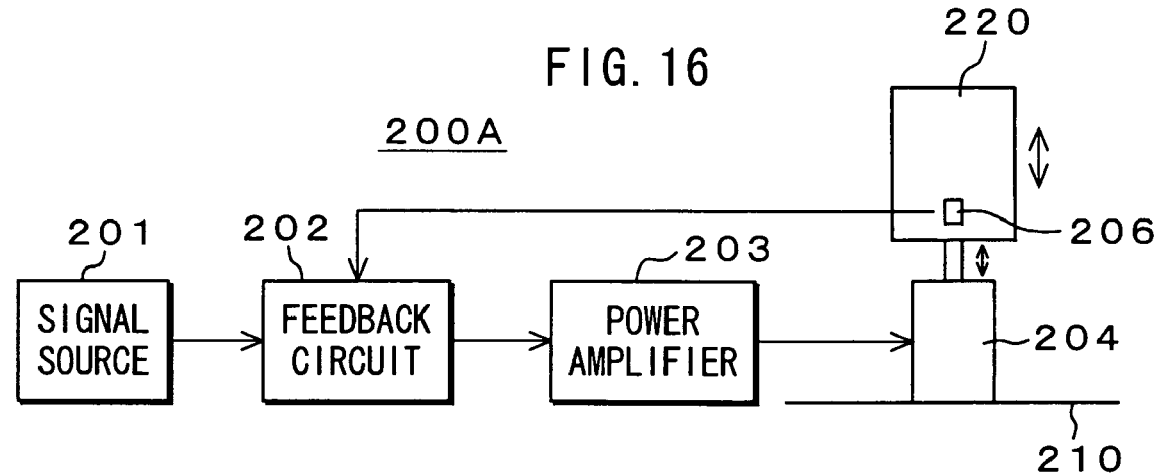
FIG. 16 a block diagram for showing a configuration of a drive output device according to a fifth embodiment of the invention.

The following will describe a drive output device according to a fifth embodiment of the invention. FIG. 16 shows a configuration of the drive output device 200A according to the fifth embodiment of the invention. In FIG. 16, like reference characters refer to like elements shown in FIG. 15, detailed explanation of which will be omitted.

This drive output device 200A is configured so that the magnetostrictive actuator 204 drives the driving load 220 that reciprocates instead of the driving load 205 that rotates. The acceleration sensor 206 is arranged on the driving load 220. Any other components of the drive output device 200A are similar to those of the drive output device 200 shown in FIG. 15. The operations of this drive output device 200A are similar to those of the drive output device 200 shown in FIG. 15.

Although the drive output devices 200, 200A shown in FIGS. 15 and 16 use the acceleration sensor 206 as the sensor, this invention is not limited thereto. The piezoelectric element 107 can be used therein similar to each of the cases of the audio output device 100 shown in FIG. 2 and the like.

It should be understood by those skilled in the art that various modifications, combinations, sub-combinations and alternations may occur depending on design requirements and other factors insofar as they are within the scope of the appended claims or the equivalents thereof.

What is claimed is:

1. The driving device, comprising:
   a magnetostrictive actuator that drives a load member based on a driving signal;
   a sensor that detects an action of the load member; and
   a compensation unit that performs feedback compensation on the driving signal which the magnetostrictive actuator receives based on a detection signal that is received from the sensor, wherein the compensation unit includes
      a phase compensation circuit that locks a phase of the detection signal from the sensor into a phase of the driving signal;
      a low-pass filter that removes from the detection signal of the sensor a high-frequency component thereof;
      an equalizer that previously corrects a fluctuation in frequency characteristic of the driving signal, said fluctuation occurring at the feedback compensation; and
      a subtracter that subtracts the detection signal of the sensor, said detection signal having been phase-locked in the phase compensation circuit and the high-frequency component of the detection signal having been removed by the low-pass filter, from the driving signal, a frequency characteristic of which has been corrected by the equalizer, thereby getting the compensated driving signal.

2. The driving device according to claim 1, wherein
   the compensation unit further includes a low-frequency component gain compensation circuit that compensates a low-frequency component of the detection signal from the sensor if a level of the detection signal drops down in the low-frequency component thereof, and
   the subtracter subtracts the detection signal from the sensor, said detection signal having been phase-locked in the phase compensation circuit, the high-frequency component of the detection signal having been removed by the low-pass filter and the low-frequency component of the detection signal having been compensated by the low-frequency component gain compensation circuit, from the driving signal, a frequency characteristic of which has been corrected by the equalizer, thereby getting the compensated driving signal.

3. A driving device, comprising:
   a magnetostrictive actuator that drives a load member based on a driving signal;
   a sensor that detects an action of the load member; and
   a compensation unit that performs feedback compensation on the driving signal which the magnetostrictive actuator receives based on a detection signal that is received from the sensor, wherein
   the sensor includes a ring-shaped piezoelectric element,
   the magnetostrictive actuator has a driving rod that transmits a displacement output, the driving rod being composed of a rod having circularly sectional configuration and having on a middle portion thereof a disc having a large diameter, and
   the piezoelectric element is positioned at a position between the disc and the load member with a front end of the driving rod contacting the load member, the piezoelectric element being sandwiched between two ring-shaped members that are made of the same material as that of the load member.

* * * * *